(12) United States Patent
Ahmad

(10) Patent No.: US 6,204,093 B1
(45) Date of Patent: Mar. 20, 2001

(54) METHOD AND APPARATUS FOR APPLYING VISCOUS MATERIALS TO A LEAD FRAME

(75) Inventor: Syed Sajid Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/916,931

(22) Filed: Aug. 21, 1997

(51) Int. Cl.$^7$ .................................................. H01L 21/44
(52) U.S. Cl. .......................... 438/118; 438/119; 438/458; 438/612
(58) Field of Search ................................. 438/106, 111, 438/123, 15, 118, 119, 458, 612

(56) References Cited

U.S. PATENT DOCUMENTS

| | | | |
|---|---|---|---|
| 4,045,863 | * 9/1977 | Mitterhummer et al. | 29/827 |
| 4,355,463 | * 10/1982 | Burns | 29/827 |
| 4,862,245 | 8/1989 | Pashby et al. | 357/70 |
| 4,876,221 | * 10/1989 | Hatada | 228/123.1 |
| 4,959,008 | * 9/1990 | Wasulko | 428/40.7 |
| 5,030,308 | * 7/1991 | Sheyon et al. | 156/235 |
| 5,049,434 | * 9/1991 | Wasulko | 428/202 |
| 5,066,614 | * 11/1991 | Dunaway et al. | 228/180.21 |
| 5,140,404 | * 8/1992 | Fogal et al. | 257/783 |
| 5,256,598 | * 10/1993 | Farnworth et al. | 29/827 |
| 5,286,679 | 2/1994 | Farnworth et al. | 437/209 |
| 5,304,842 | * 4/1994 | Farnworth et al. | 257/668 |
| 5,409,863 | 4/1995 | Newman | 437/209 |
| 5,548,160 | 8/1996 | Corbett et al. | 257/666 |
| 5,563,443 | 10/1996 | Beng et al. | 257/666 |
| 5,696,033 | 12/1997 | Kinsman | 437/217 |
| 5,733,800 | 3/1998 | Moden | 437/220 |
| 5,739,053 | 4/1998 | Kawakita et al. | 438/108 |
| 5,773,322 | * 6/1998 | Weld | 438/123 |
| 5,834,062 | 10/1998 | Johnson et al. | 427/208.6 |
| 5,923,957 | 7/1999 | Song et al. | 438/118 |

* cited by examiner

*Primary Examiner*—John F. Niebling
*Assistant Examiner*—Christopher Lattin
(74) *Attorney, Agent, or Firm*—Ormiston & McKinney PLLC

(57) ABSTRACT

The invention is directed to the application of viscous materials, such as the adhesives used in LOC die attach processes, to a lead frame by forming a film of viscous material and then bringing a portion of the lead frame and the film of viscous material into contact with one another. In one exemplary embodiment of the method of the invention, the viscous material is drop dispensed, sprayed, pumped or otherwise placed on a carrier surface, the material is spread to a uniform film thickness and then brought into contact with the die attach portion of the lead frame. One embodiment of the apparatus for applying the viscous material includes (1) a carrier surface, (2) a plurality of orifices in fluid communication with the carrier surface, and (3) a pump for pumping the viscous material through the orifices to the carrier surface. The apparatus may also include a metering blade for spreading the material to a uniform film thickness over the carrier surface.

14 Claims, 10 Drawing Sheets

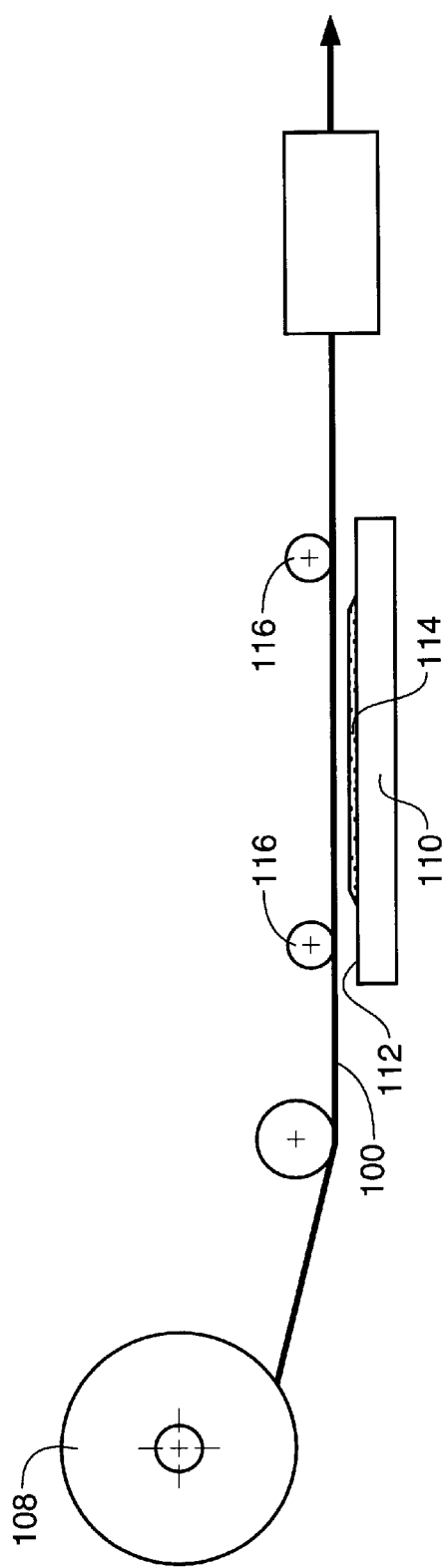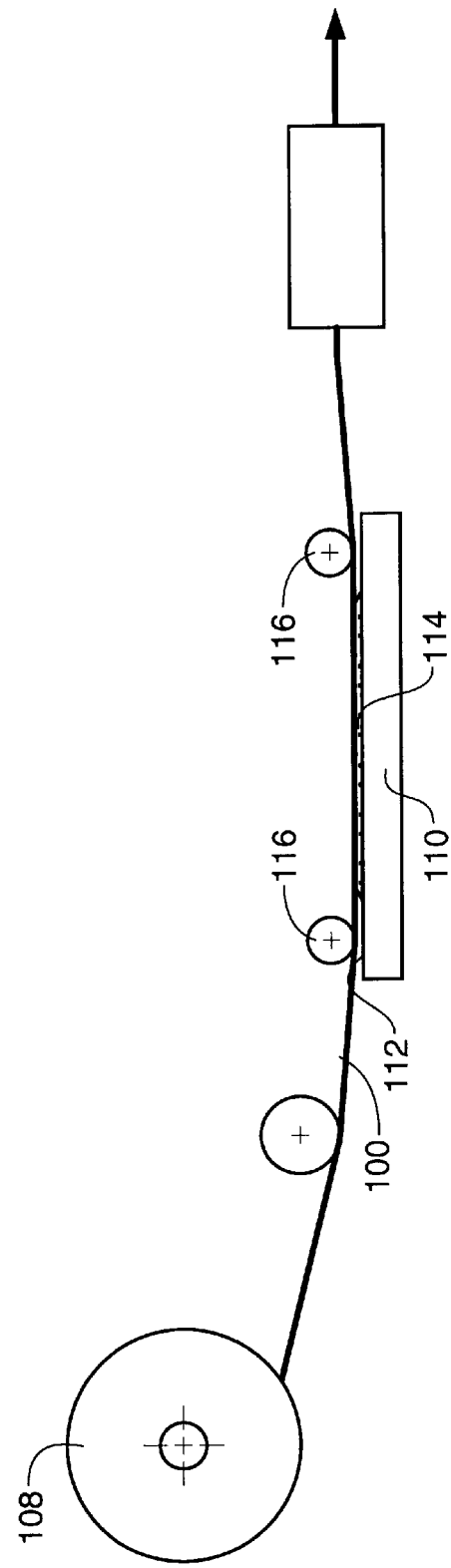

METHOD AND APPARATUS FOR APPLYING VISCOUS MATERIALS TO A LEAD FRAME

FIELD OF THE INVENTION

The invention relates generally to semiconductor assembly processes and equipment and, more particularly, to the application of adhesives and other viscous materials to components of a semiconductor device lead frame.

BACKGROUND OF THE INVENTION

Higher performance, lower cost, increased miniaturization of semiconductor components, and greater packaging density of integrated circuits are goals of the computer industry. One way to reduce the overall cost of a semiconductor component is to reduce the manufacturing cost of that component. Lower manufacturing costs can be achieved through faster production and/or reduction in the amount of materials used in fabricating the semiconductor component.

One area where faster production and reduction in material usage can be achieved is lead frame attachment to semiconductor dice. U.S. Pat. No. 5,286,679 issued Feb. 15, 1994 to Farnworth et al. ("the '679 patent"), assigned to the assignee of the present invention and incorporated herein by reference, teaches attaching leads to a semiconductor device with adhesive material in a "lead-over-chip" ("LOC") configuration. The '679 patent teaches applying a patterned thermoplastic or thermoset adhesive layer to a semiconductor wafer. The adhesive layer is patterned to keep the "streets" on the semiconductor wafer clear of adhesive for saw cutting and to keep the wire bonding pads on the individual dice clear of adhesive for wire bonding. Patterning of the adhesive layer is generally accomplished by hot or cold screen/stencil printing or dispensing by roll-on. Following the printing and baking of the adhesive layer on the semiconductor wafer, the individual dice are cut from the semiconductor wafer. During packaging, each adhesive coated die is attached to lead fingers of a lead frame by heating the adhesive layer and pressing the lead fingers onto the adhesive. If the adhesive layer is formed of a thermoset material, a separate oven cure is required. Furthermore, the adhesive layer may be formulated to function as an additional passivating/insulating layer or alpha barrier for protecting the packaged die.

Although the teaching of the '679 patent is an effective method for attaching leads in a LOC configuration, it is sometimes difficult to achieve an adequate profile on the adhesive such that there is sufficient area on the top of the adhesive to attach the lead fingers. The process disclosed on the '679 patent is illustrated in FIGS. 15–21. FIG. 15 illustrates a cross sectional view of a semiconductor substrate 302 with a bond pad 304, wherein a stencil or a screen print template 306 has been placed over the semiconductor substrate 302, generally a silicon wafer. The stencil or screen print template 306 is patterned to clear the area around the bond pads 304 and to clear street areas 308 for saw cutting (i.e., for singulating the substrate into individual dice). An adhesive material 310 is applied to the stencil or screen print template 306, as shown in FIG. 16. Ideally, when the stencil or screen print template 306 is removed, adhesive prints 312 are formed with vertical sidewalls 314 and a planar upper surface 316, as shown in FIG. 17. However, since the adhesive material 310 must have sufficiently low viscosity to flow and fill the stencil or screen print template 306, as well as allow for the removal of the stencil or screen print template 306 without the adhesive material 310 sticking thereto, the adhesive material 310 of the adhesive prints 312 may spread, sag, or flow laterally under the force of gravity after the removal of the stencil or screen print template 306, as shown in FIG. 18. This post-application flow of adhesive material 310 can potentially cover all or a portion of the bond pads 304 or interfere with the singulating of the semiconductor wafer by flowing into the street areas 308.

Furthermore, and of even greater potential consequence than bond pad or street interference is the effect that the lateral flow or spread of adhesive material 310 has on the adhesive material upper surface 316. As shown in FIG. 19, the adhesive material upper surface 316 is the contact area for lead fingers 318 of a lead frame 320. The gravity-induced flow of the adhesive material 310 causes the once relatively well-defined edges 322 of the adhesive material to curve, resulting in a loss of surface area 324 (the ideal shape is shown with dotted lines) for the lead fingers 318 to attach. This loss of surface area 324 is particularly problematical for the adhesive print material upper surface 316 at the longitudinal ends 326 (seen in FIG. 20). At the adhesive material longitudinal ends 326, the adhesive material flows in three directions (to both sides as well as longitudinally) causing a severe curvature 328, as shown in FIGS. 20 and 21. The longitudinal ends of the adhesive print on patch flow in a 180° flow front resulting in blurring of the print boundaries into a curved perimeter. This curvature 328 results in complete or near complete loss of effective surface area on the adhesive material upper surface 316 for adhering the outermost lead finger closest to the adhesive material end 326 (lead finger 330). This results in what is known as a "dangling lead." Since the lead finger 330 is not adequately attached to the adhesive material end 326, the lead finger 330 may move or bounce when a wire bonding apparatus attempts to attach a bond wire between the lead finger 330 and its respective bond pad 304. This movement can cause inadequate bonding or non-bonding between the bond wire and the lead finger 330, resulting in the failure of the component due to a defective electrical connection.

LOC attachment can also be achieved by attaching adhesive tape, preferably insulative, to an active surface of a semiconductor die, then attaching lead fingers to the insulative tape. As shown in FIG. 22, two strips of adhesive tape 410 and 410' are attached to an active surface 412 of a semiconductor die 404. The two adhesive tape strips 410, 410' run parallel to and on opposing sides of a row of bond pads 406. Lead fingers 402, 402' are then attached to the two adhesive tape strips 410, 410', respectively. The lead fingers 402, 402' are then electrically attached to the bond pads 406 with bond wires 408. Although this method is effective in attaching the lead fingers 402, 402' to the semiconductor die 404, this method is less cost effective than using adhesive since the cost of adhesive tape is higher than the cost of adhesive material. The higher cost of the adhesive tape is a result of the manufacturing and placement steps which are required with adhesive tapes. The individual tape segments are generally cut from a larger tape sheet. This cutting requires precision punches with extremely sharp and accurate edges. These precision punches are expensive and they wear out over time. Furthermore, there is always waste between the segments which are punched out, resulting in high scrap cost. Moreover, once punch out is complete, the tape segments are placed on a carrier film for transport to the die-attach site. Thus, there are problems with placement, alignment, and attachment with film carriers, plus the cost of the film carrier itself.

LOC attachment can also be achieved by placing adhesive material on the lead fingers of the lead frame rather than on the semiconductor substrate. As shown in FIG. 23, the adhesive material 502 may be spray applied on an attachment surface 504 of lead fingers 506. However, the viscous nature of the adhesive material 502 results in the adhesive material 502 flowing down the sides 508 of the lead finger 506 and collecting on the reverse, bond wire surface 510 of the lead finger 506, as shown in FIG. 24. The adhesive material 502, which collects and cures on the bond wire surface 510, interferes with subsequent wire bonding, which in turn, can result in a failure of the semiconductor component. The flow of adhesive material 502 for the attachment surface 504 to the bond wire surface 510 can be exacerbated if the lead fingers 506 are formed by a stamping process rather than by etching, the other widely employed alternative. The stamping process leaves a slight curvature 512 to edges 514 of at least one surface of the lead finger 506, as shown in FIG. 25. If an edge curvature 512 is proximate the lead finger attachment surface 504, the edge curvature 512 results in less resistance (i.e., less surface tension) to the flow of the adhesive material 502. This, of course, results in the potential for a greater amount of adhesive material 502 to flow to the bond wire surface 510.

Furthermore, present methods of adhesive material application on a surface (whether the semiconductor die or the lead fingers) tend to waste adhesive material. For example, spray application loses a great deal of adhesive material because not all of the sprayed adhesive material attaches to the target surface. As another example, the patterning of an adhesive layer on a semiconductor die, such as described in the '679 patent, results in a substantial area of the adhesive pattern not being utilized to attach leads.

SUMMARY OF THE INVENTION

The invention is directed to the application of viscous materials, such as the adhesives used in LOC die attach processes, to a lead frame by forming a film of viscous material and then bringing a portion of the lead frame and the film of viscous material into contact with one another. In one exemplary embodiment of the method of the invention, the viscous material is drop dispensed, sprayed, pumped or otherwise placed on a carrier surface, the material is spread to a uniform film thickness and then brought into contact with the die attach portion of the lead frame. One embodiment of the apparatus for applying the viscous material includes (1) a carrier surface, (2) a plurality of orifices in fluid communication with the carrier surface, and (3) a pump for pumping the viscous material through the orifices to the carrier surface. The apparatus may also include a metering blade for spreading the material to a uniform film thickness over the carrier surface.

DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 2 and 3 are schematic representations of one embodiment of the invention in which the lead fingers are biased against the adhesive film;

The figures are not actual views of semiconductor devices, components or processing equipment. Rather, the figures are idealized representations used to better illustrate different embodiments of invention in conjunction with the following detailed description.

DETAILED DESCRIPTION OF THE INVENTION

Figure 1:
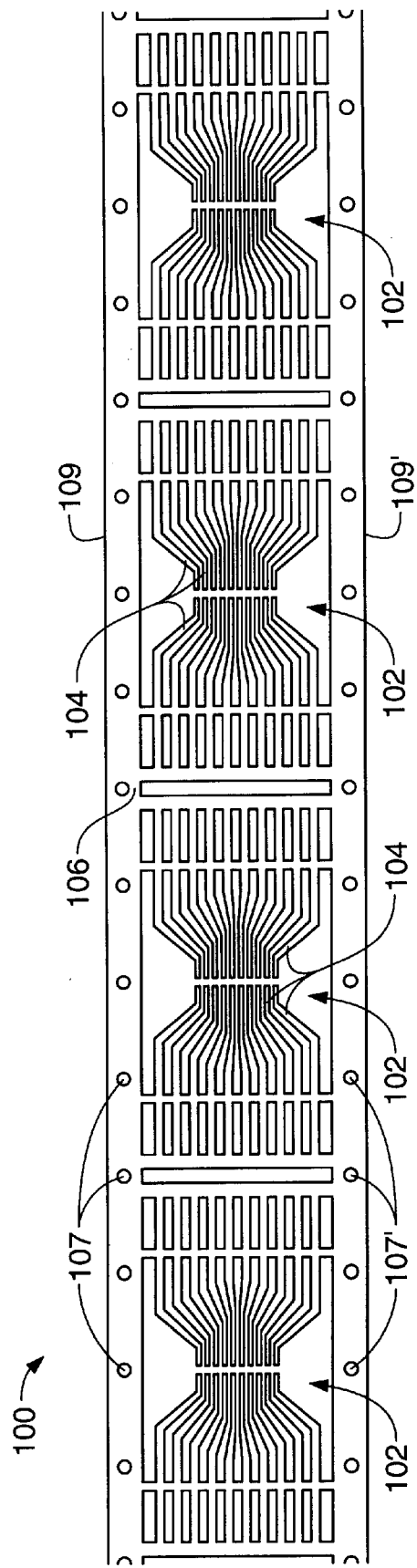
FIG. 1 is a top plan view of a lead frame strip.

FIG. 1 illustrates a portion of an exemplary lead frame strip 100. Individual lead frames 102, each including a plurality of lead fingers 104, are formed in a long, thin strip of conductive material 106, such as copper, copper alloy, or the like. The lead frames 102 are generally formed by a stamping process or an etching process. The lead frames 102 are formed side-by-side along the conductive material strip 106 wherein the conductive material strip 106 includes a plurality of indexing holes 107, 107' on opposing lengthwise edges 109, 109', respectively, of the conductive material strip 106. The indexing holes 107, 107' are used to move the lead frame strip 100 and align the lead frames 102 throughout a process of attaching the lead frames 102 to semiconductor dice.

Referring to FIGS. 2 and 3, a lead frame strip 100 such as illustrated in FIG. 1 is fed from a source 108, such as a spool, to an adhesive carrier plate 110. As the lead fingers (not shown) are aligned over carrier plate 110, lead frame strip 100 is biased downward as shown in FIG. 3, such as by hydraulic, pneumatic, or electrically-powered biasing mechanism 116, to contact a film of adhesive material 114 on the surface 112 of carrier plate 110. The adhesive material may be any viscous adhesive material including but not limited to thermoplastics, thermoset resins, flowable pastes, and B-stage adhesive materials. Preferred adhesive materials include polyimide, epoxy, bismaleimide and cyanate ester.

Figure 4:
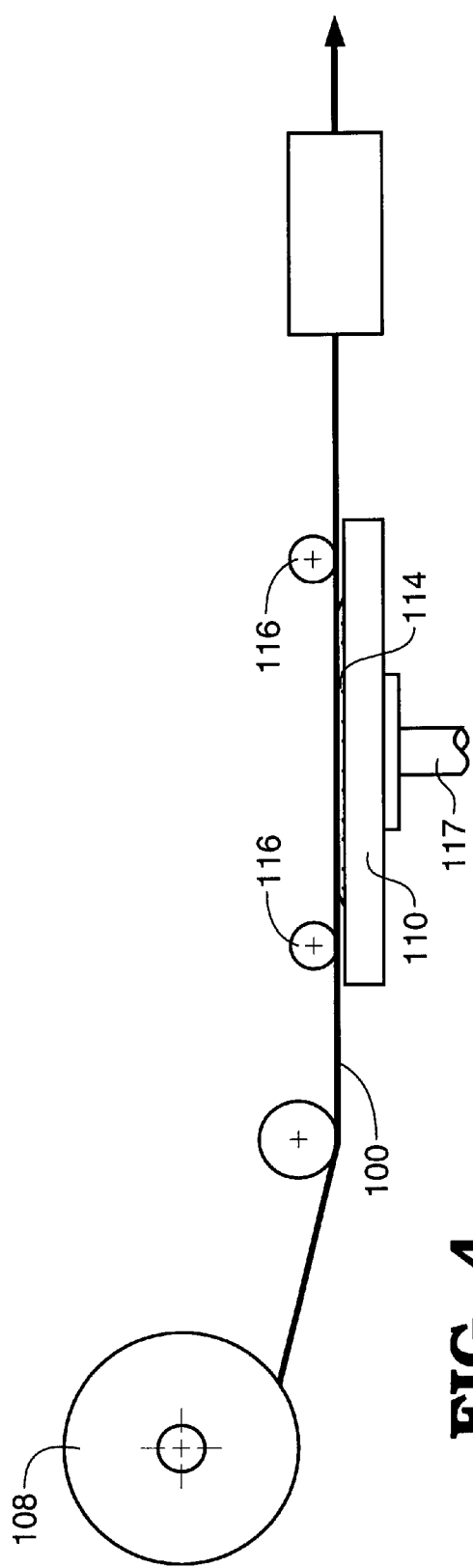
FIG. 4 is a schematic representation of another embodiment of the invention in which the adhesive film is biased against the lead fingers.

FIG. 4 illustrates another embodiment, similar to that shown in FIGS. 2 and 3, except that in the embodiment of FIG. 4 the biasing mechanism is an elevator 117 that moves carrier plate 110 up to contact the lead fingers rather than moving the lead frame strip down to contact the carrier plate.

Figure 5:
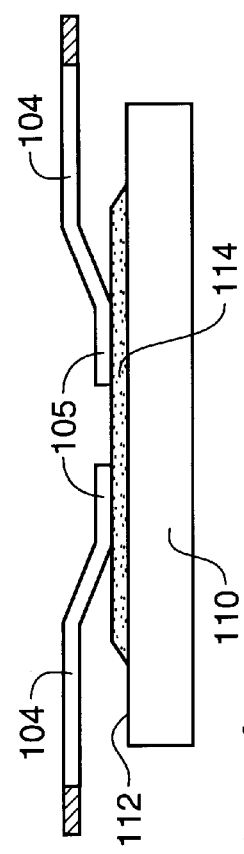
FIGS. 5 is an elevation view showing the application of adhesive to offset lead fingers.
Figure 13:
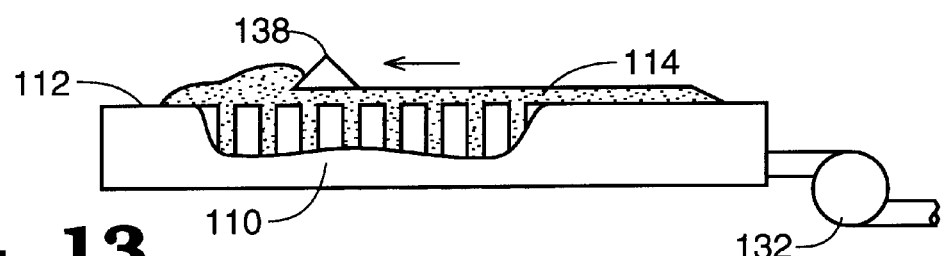
FIGS. 13 is a schematic representation of another system for applying a film of adhesive to a carrier plate.

As an alternative to the biasing mechanisms 116 and 117 shown in FIGS. 2–4, or in combination with those biasing mechanism, lead fingers 104 may be offset as shown in FIG. 5 so that only the ends 124 of lead fingers 104 contact the film of adhesive material 114 as the lead frame strip 100 moves over carrier plate 110. Using the offset lead fingers shown in FIG. 5 helps ensure that adhesive is applied to only those portions of the lead fingers that attach to the semiconductor dice. As another alterative, planar or offset lead fingers 104 may be brought into close proximity to adhesive film 114 and then additional adhesive material may be pumped or otherwise delivered to the surface 112 of carrier plate 110 to raise the level of adhesive film 114 to contact lead fingers 104. A system for pumping adhesive to surface 112 is shown in FIG. 13.

Figure 6:
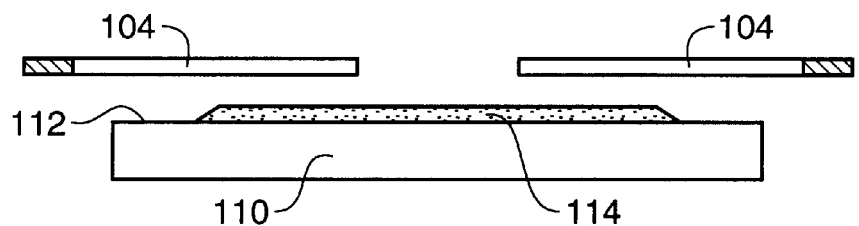
FIGS. 6–8 are elevation views showing the application of adhesive to planar lead fingers.
Figure 7:
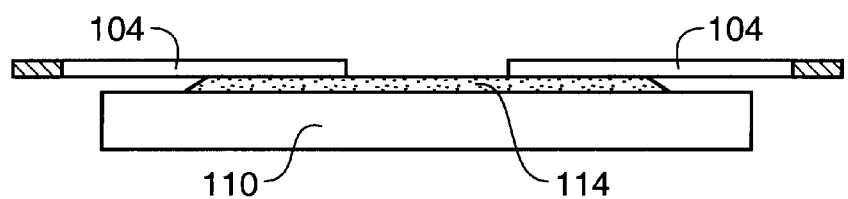
Figure 8:
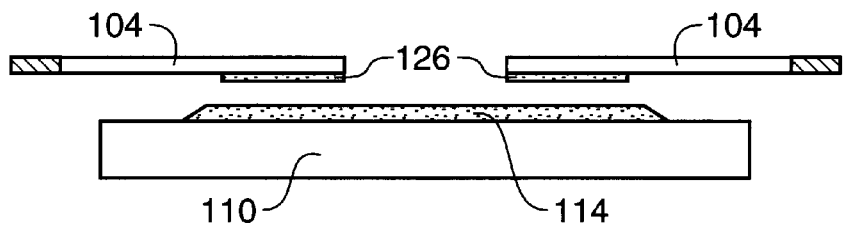

FIGS. 6–8 illustrate side views of planar lead fingers 104 being brought into contact with the adhesive material 114 and being retracted therefrom. As shown in FIG. 6, lead fingers 104 are positioned over carrier plate 110. The lead fingers 104 are lowered onto or proximate the film of the adhesive material 114 as shown in FIG. 7. When the bottom surface 124 of the lead fingers 104 comes in contact with adhesive film 114, the adhesive material wets out across the bottom surface 124 of the lead finger 104. As shown in FIG. 8, when lead fingers 104 are retracted from the adhesive material, the cohesion of the adhesive material with the lead fingers 104 pulls some of the adhesive material from film 114 to form an adhesive film 126 on the bottom surface 124 of the lead finger 104. The thickness of the adhesive film 126 can range from 0.1 to 15 millimeters depending on the viscosity of the adhesive material. Changing the shape of lead finger 104, changing the rheology of the adhesive material, pre-coating lead finger 104 with a surfactant, such as NMP, or placing a solvent in the adhesive material to improve wetting, and/or adding adhesion promoters, such as silane, siloxane, or polyimide siloxane, to the adhesive material will also change the thickness and/or pattern of adhesive film 126 on lead finger 104. It is desirable that the adhesive material flow easily to form a uniform film 114 across carrier plate 110 and adhere to lead fingers 104, but not run off lead fingers 104 as they are removed from contact with adhesive film 114. Carrier plate 110 and adhesive film 114 can be shaped and positioned such that when lead fingers 104 contact film 114 the exposed surface 122 of the adhesive material 114, the adhesive material 114 attaches to only specific, desired portions of the lead fingers 104.

Figure 9:
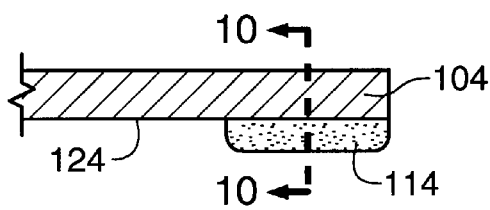
FIG. 9 is a detail cross sectional view of a lead finger after application of adhesive.
Figure 10:
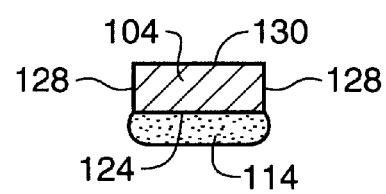
FIG. 10 is a cross sectional view taken along the line 10—10 in FIG. 9.

FIG. 9 is a cross sectional view of a lead finger 104 after application of the adhesive material. FIG. 10 is a cross sectional view of lead finger 104 taken along the line 10—10 in FIG. 9. As shown in FIGS. 9 and 10, by only contacting bottom surface 124 of lead finger 104 to adhesive film 114, the adhesive material will not wet sides 128 of the lead finger 104 and, of course, will not collect on bond wire surface 130 of lead finger 104 (the bond wire surface 130 is the lead finger surface where a bond wire is subsequently attached during further processing). Since the adhesive material does not collect on bond wire surface 130, there will be no adhesive material to interfere with a wire bonding step subsequent to LOC attachment of lead fingers 104 to an active surface of a semiconductor die.

It is desireable that adhesive film 114 be as level as possible. If film 114 is not substantially level, lead fingers 104 may dip too deeply into the adhesive material 114. When this occurs, the adhesive material 114 may wet the lead finger sides 128 and may even wet the lead finger bond wire surface 130. If the adhesive material wets the bond wire surface 130, the adhesive material may interfere with wire bonding subsequent to LOC attachment, as mentioned above.

Figure 11:
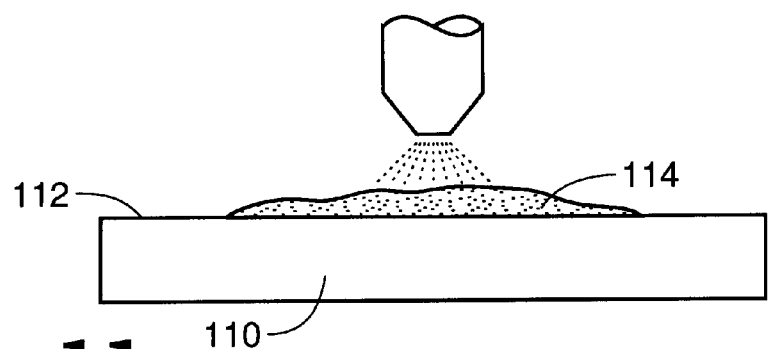
FIGS. 11 and 12 are schematic representations of one system for applying a film of adhesive to a carrier plate.
Figure 12:
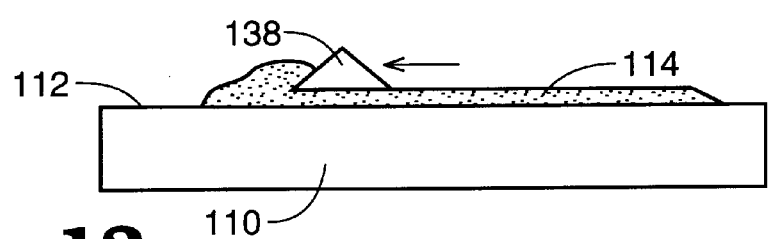

A variety of techniques may used to form adhesive film 114 on carrier plate 110. In FIGS. 11 and 12, adhesive material is sprayed onto carrier plate 110 through a centrally located dispensing nozzle 150. The adhesive is then spread evenly into film 114 using a metering blade 138. Alternatively, the adhesive material may be pumped up through an array of orifices 152 on to surface 112 of carrier plate 110, as shown in FIG. 13. The adhesive material might also be machine or hand troweled on to carrier plate 110. Metering blade 138 can be used to maintain the desired thickness and uniformity of adhesive film 114.

Figure 14:
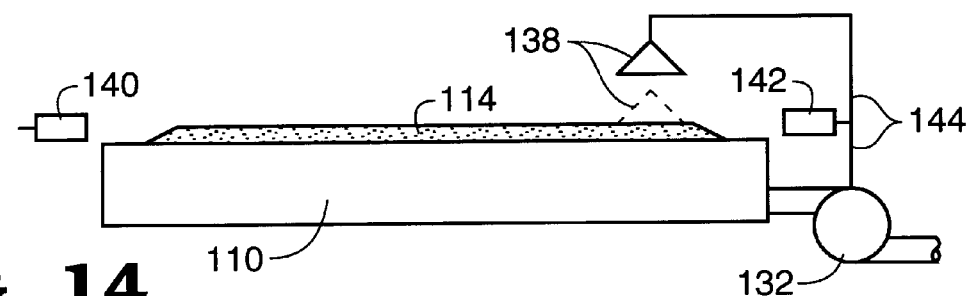
FIG. 14 is a schematic representation of a height detection and control loop for maintaining the height of the film of adhesive on the carrier plate.
Figure 15:
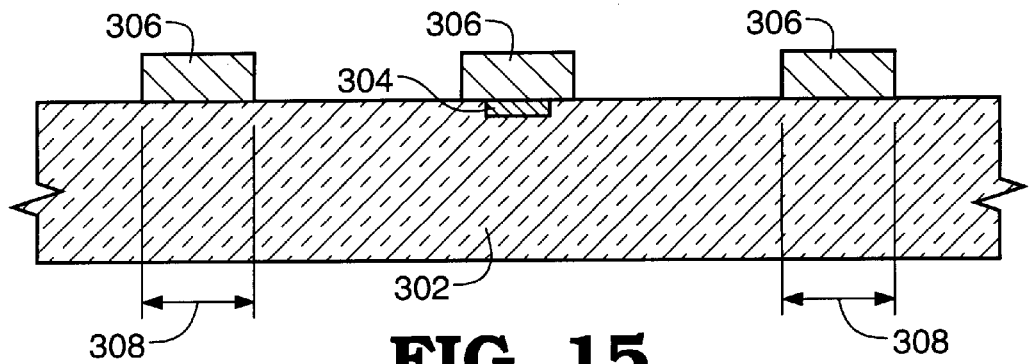
FIGS. 15–21 are side cross-sectional views of a prior art technique of forming adhesive areas on a substrate for LOC attachment.
Figure 16:
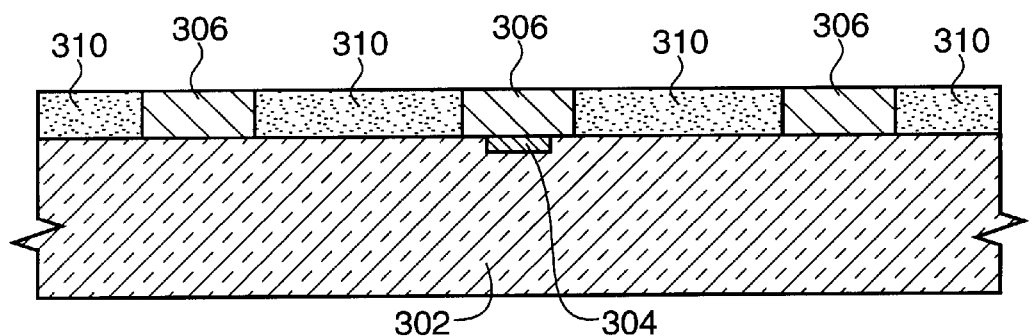
Figure 17:
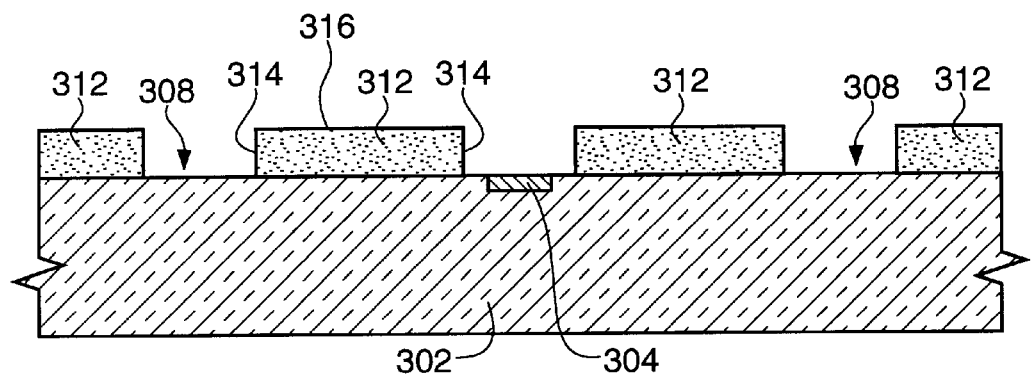
Figure 18:
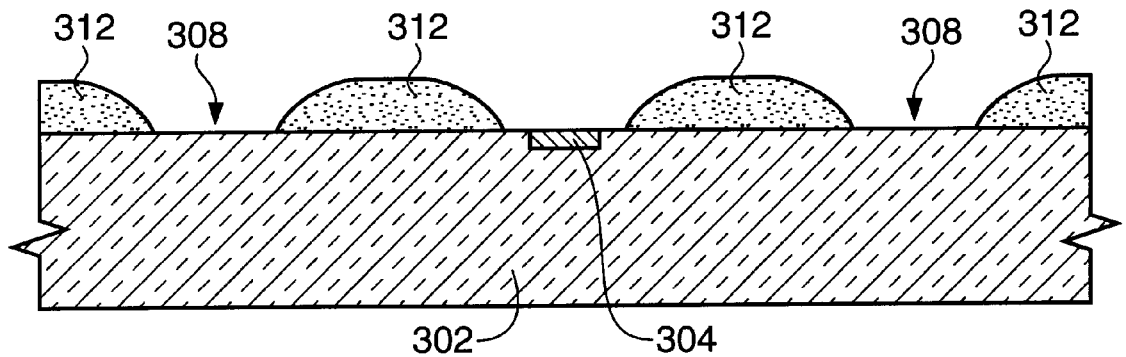
Figure 19:
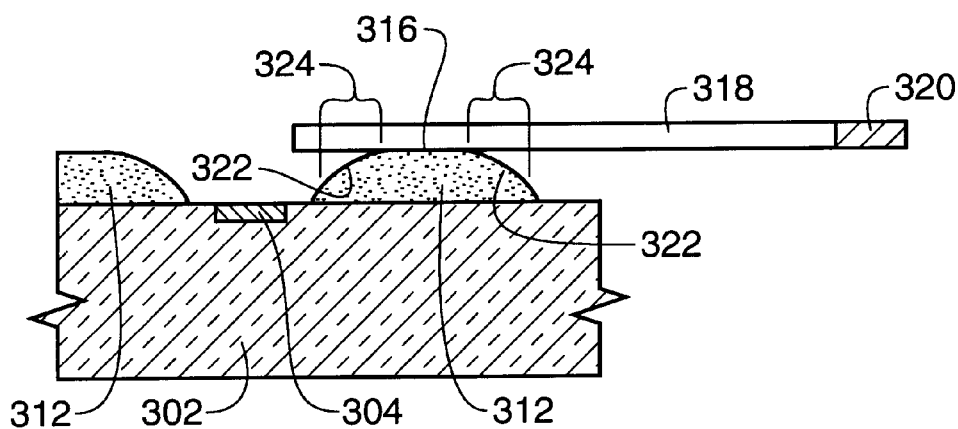
Figure 20:
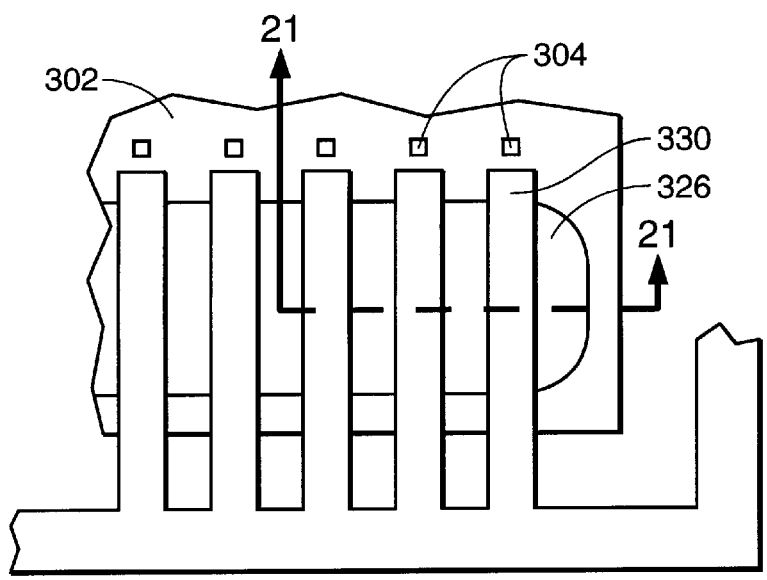
Figure 21:
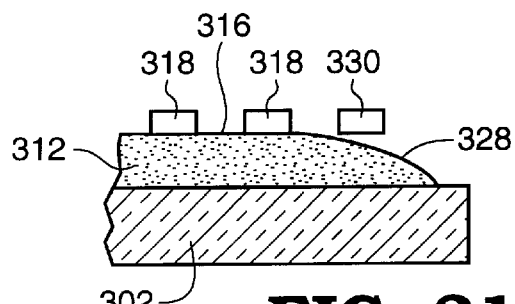
Figure 22:
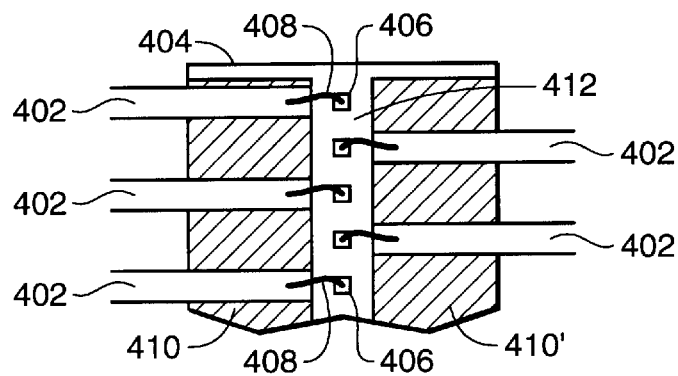
FIG. 22 is a top view of a prior art technique of LOC attachment using adhesive tape.
Figure 23:
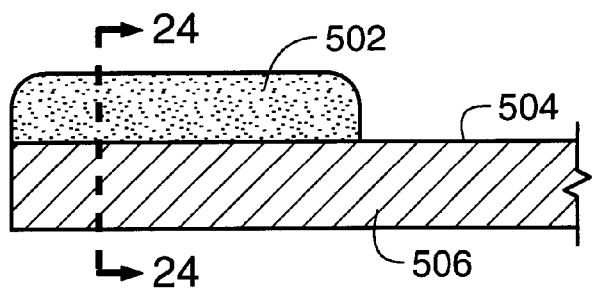
FIGS. 23–25 are cross sectional views of a prior art technique of forming adhesive areas on lead fingers for LOC attachment.
Figure 24:
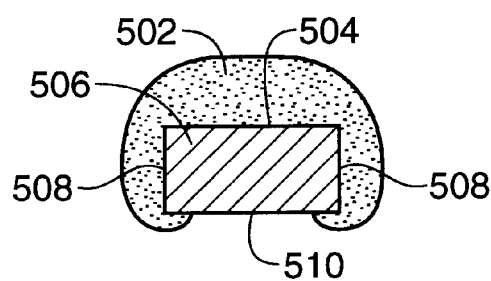

Furthermore, a variety of feed back and feed forward control schemes may be used to control the thickness and uniformity of film 114. One such control scheme is shown in FIG. 14. A detection mechanism, shown as a transmitter 140 and a receiver 142, is used to determine the thickness and/or the uniformity of the surface of film 114. A control signal 144 triggers pump 132 to pump or stop pumping to achieve the desired thickness. The control signal can also be used to trigger metering blade 138 to move across film 114 to maintain thickness and uniformity. The transmitter 140 and receiver 142 may be a light (preferably a laser) transmitter and receiver. When a light beam (not shown) from the transmitter 140 is altered by the exposed surface 122, the receiver 142 detects the discontinuation of light transmission and generates the control signal 144. Additionally, the transmitter 140 and receiver 142 may be an ultrasonic transmitter and receiver. When an ultrasonic sound wave (not shown) from the transmitter 140 is altered by the exposed surface 122, the receiver 142 detects the change in transit time or phase shifts of the ultrasonic sound wave and generates the control signal 144.

It is desireable, of course, to precisely control the relative positions of lead frames 102 and adhesive film 114 to better control the depth to which lead fingers 104 are dipped into film 114.

The invention contemplates the use of a single carrier plate or a series or array carrier plates as necessary or desireable to accommodate the LOC die attach process. Once the adhesive material has been applied to lead fingers 104, lead frame strip 100 may, optionally, be fed to a curing oven 118, shown in FIGS. 2–4, to set the adhesive material. Preferably, the adhesive material is cured with the lead frame in a downward facing position. The advantages of placing viscous material, such as an adhesive material, in a downward facing position are described in U.S. patent application Ser. No. 08/709,182 by Tongbi Jiang and Syed S. Ahmad filed Sep. 6, 1996, assigned to the assignee of the present invention and hereby incorporated herein by reference. Rather than gravitational forces causing the viscous material to flow and expand as when on top of the lead frame, the gravitational forces on the inverted lead frame maintain the shape and boundary definition of the viscous material. The adhesive should be compatible with the lead finger material so as to adhere thereto and must not be of such a low viscosity that it drips when the lead fingers are removed from contact with the adhesive film. Preferably, the viscous materials have viscosities between about 1000 cps and 500,000 cps. Furthermore, with regard to drying or curing an adhesive material, the lead frame need only be inverted until the viscous adhesive material has stabilized sufficiently to maintain its shape and boundary definition. Depending on the particular viscous adhesive material used, the minimum inversion time could be the time required to cure the outer surfaces of the viscous adhesive material such that a film is formed which contains the as yet uncured viscous adhesive material therein, or the minimum inversion time could be the time required to completely dry or cure of the viscous adhesive material.

Figure 26:
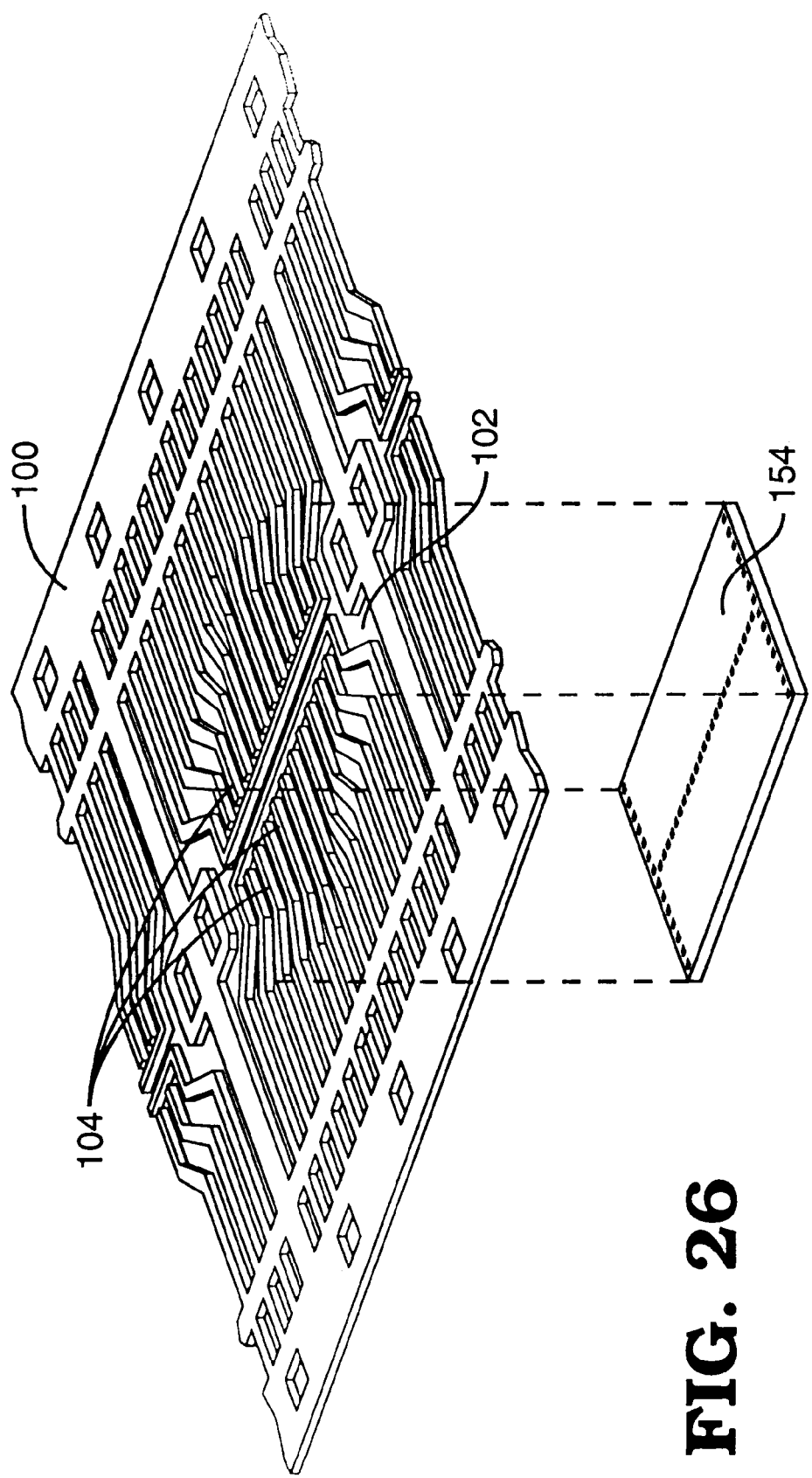
FIG. 26 is an isometric exploded view illustrating an LOC die attachment.

Referring to FIG. 26, a semiconductor die 154 is attached to lead frame 102. In a typical LOC die attach process, adhesive film 126 on lead fingers 104 is heated by heating lead frame 102 and then the lead fingers 104, adhesive film 126 and die 154 are pressed together. The adhesive film 126 on lead fingers 104 may also be heated by pressing the adhesive coated lead fingers in to a heated die 154. Once die 154 is attached to lead frame 102, the assembly is encapsulated according to conventional semiconductor packaging process steps.

Figure 25:
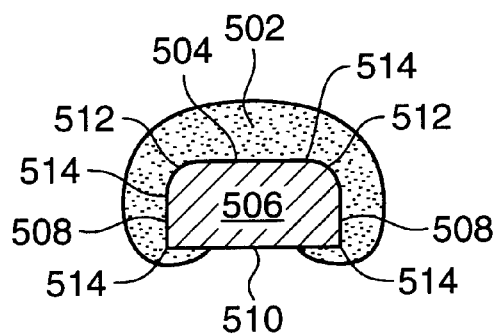

The present invention is not limited to the above detailed description. The structures coated are not limited to lead frames and can include TAB structures and the like. The lead frames may not be limited to delivery in strips, but can be delivered individually or in sheets. The adhesive material can be applied to a structure under at least a partially-evacuated chamber such that lower-viscosity materials applied to the structure would be at least partially dried or cured prior to removal from the chamber. Further, the invention is not limited to only adhesives applied to lead fingers. Other viscous materials could be applied using the invented method and apparatus. It is also contemplated that viscous materials may be applied to bus bars, die attach paddles, or other components of a lead frame. Moreover, the carrier plate may embodied in different designs. One example of an alternative design is illustrated in U.S. patent application attorney docket no. 3089US(96-0734) filed Aug. 5, 1997 by Moden et al. and assigned to the assignee of the present invention. FIG. 25 and the accompanying text of the Moden et al. patent application, which is incorporated herein by reference, shows a plate-type reservoir (150) in which a thin layer of viscous material (152) is delivered across plate (154) from an inlet (156) to an opposing outlet (158).

Having thus described in detail the preferred embodiments of the invention, it is to be understood that the invention defined by the appended claims is not to be limited by particular details set forth in the above description as variations thereof are possible without departing from the spirit or scope thereof.

What is claimed is:

1. A method for applying flowable material to a lead frame, comprising forming a film of flowable material on a carrier surface, bringing a portion of the lead frame and the film of flowable material into contact with one another, separating the portion of the lead frame from the film of flowable material on the carrier surface, and leaving flowable material on the portion of the lead frame.

2. A method according to claim 1, wherein the step of bringing a portion of the lead frame and the film of flowable material into contact with one another comprises biasing the lead frame against the film of flowable material.

3. A method according to claim 1, wherein the step of bringing a portion of the lead frame and the film of flowable material into contact with one another comprises biasing the film of flowable material against the lead frame.

4. A method according to claim 2, wherein the step of biasing the lead frame against the film of flowable material comprises offsetting the portion of the lead frame contacting the flowable material from other portions of the lead frame.

5. A method for applying flowable material to a lead frame, comprising:
placing flowable material on a surface;
forming a film of the flowable material on the surface;
bringing a portion of the lead frame and the film of flowable material into contact with one another;
separating the portion of the lead frame from the film of flowable material on the surface;
and leaving flowable material on the portion of the lead frame.

6. A method according to claim 5, further comprising placing an excess of the flowable material onto the surface and spreading the flowable material to a uniform film thickness.

7. A method according to claim 5, further comprising placing an excess of the flowable material onto the surface and blading the flowable material to a uniform film thickness.

8. A method for applying flowable material to a lead frame, comprising:
providing a carrier surface and an array of orifices in fluid communication with the surface;
feeding a flowable material through the orifices on to the surface; and
bringing a portion of the lead frame and the flowable material into contact with one another.

9. A method according to claim 8, further comprising spreading the flowable material to a uniform film thickness on the carrier surface.

10. A method according to claim 8, further comprising monitoring a height of the flowable material above the carrier surface and controlling the feeding of the flowable material through the orifices according to the height of the flowable material.

11. A method for applying viscous material to lead fingers on a lead frame, comprising:

dispensing adhesive material on to a surface;

spreading the adhesive material to a uniform thickness;

bringing the lead fingers material into contact with one another;

separating the lead fingers from the adhesive material on the surface; and leaving adhesive material on the lead fingers.

12. A method for applying adhesive material to lead fingers on a lead frame, comprising:

placing adhesive material on to a surface;

spreading the adhesive material to a uniform thickness;

offsetting at least a portion of the lead fingers from other portions of the lead frame;

dipping the offset portions of the lead fingers in the adhesive material;

removing the offset portions of the lead fingers from the adhesive material on the surface; and leaving adhesive material on the offset portions of the lead fingers.

13. A method for attaching a semiconductor die to a lead frame having a plurality of lead fingers configured to extend across a surface of the die, the method comprising:

forming a film of adhesive material on a carrier surface;

bringing a die attach portion of the lead fingers and the film of adhesive material into contact with one another;

separating the die attach portion of the lead fingers from the film of adhesive material on the carrier surface;

leaving adhesive material on the die attach portion of the lead fingers; and pressing the die and the die attach portion of the lead fingers together.

14. A method for attaching a semiconductor die to a lead frame having a plurality of lead fingers configured to extend across a surface of the die, the method comprising:

offsetting a die attach portion of the lead fingers from the other portions of the lead frame forming a film of adhesive material on a carrier surface;

dipping the die attach portion of the lead fingers in the film of adhesive material;

removing the offset portions of the lead fingers from the adhesive material on the carrier surface;

leaving adhesive material on the die attach portion of the lead fingers; and pressing the die and the die attach portion of the lead fingers together.

* * * * *